United States Patent [19]

Yoshizumi et al.

[11] Patent Number: 5,051,399

[45] Date of Patent: Sep. 24, 1991

[54] SUPERCONDUCTIVE RESIN MATERIAL

[75] Inventors: Motohiko Yoshizumi; Hideo Arai, both of Saitama, Japan

[73] Assignee: Mitsubishi Kinzoku Kabushiki Kaisha, Tokyo, Japan

[21] Appl. No.: 250,120

[22] Filed: Sep. 28, 1988

[30] Foreign Application Priority Data

Sep. 29, 1987 [JP] Japan ................................ 62-242467

[51] Int. Cl.$^5$ ................................................ H01B 1/06

[52] U.S. Cl. ........................................ 505/1; 252/518; 252/521

[58] Field of Search .................... 252/521, 518; 505/1, 505/780, 785

[56] References Cited

PUBLICATIONS

"Thin Film Processing and Characterization of High-Temperature Superconductors", American Vacuum Society, Series 3; Nov. 6, 1987, McAndrews et al.; pp. 451–458.

Nature, vol. 327, Jun. 4, 1987.

"Fabrication of Ceramic Articles from High to Superconducting Oxides", *Advanced Ceramics Materials,* Jul. 1987, pp. 364–366.

*Primary Examiner*—Josephine Barr
*Attorney, Agent, or Firm*—Oblon, Spivak, McClelland, Maier & Neustadt

[57] ABSTRACT

A superconductive resin material comprising a resin matrix in which 70–90% by weight on the basis of the total composition of a superconductive compound metal oxide powder is homogeneously dispersed is disclosed.

5 Claims, No Drawings

SUPERCONDUCTIVE RESIN MATERIAL

FIELD OF THE INVENTION

This invention relates to superconductive resin material which comprises a resin matrix in which superconductive compound metal oxide powder is dispersed.

BACKGROUND OF THE INVENTION

Compound metal oxides of a rare earth metal, an alkaline earth metal and copper of specific compositions have recently drawn attention as superconductor materials which exhibit superconductivity at temperatures higher than the boiling point of liquefied nitrogen. These materials are available only in the form of powder or sinter at present. Flexible superconductive materials are not yet known, but are desired today as materials for electromagnetic shielding, for preparing printed electric circuits in which small electric current flows, etc.

Superconductive compound metal oxides per se are known. Various processes have been proposed for preparing them.

Typical of these are:

(1) a process in which an oxide, a carbonate or an oxalate of the respective component metals are physically crushed and mixed in the state of powder, and the mixture is fired and pulverized;

(2) a process in which water-soluble salts such as nitrates, chlorides, etc. of the respective component metals are dissolved in water to make a homogeneous solution, the metals are coprecipitated as insoluble hydroxides, carbonates or oxalates by addition of hydroxide ions, carbonate ions or oxalate ions, and the coprecipitate is collected and fired into a compound metal oxide; and (3) a rather recently developed process in which an organic solvent solution (strictly speaking, suspension) of organic compounds, especially alkoxides, of the component metals is hydrolyzed, and the resulting compound hydroxide is fired to give a compound metal oxide.

We tried to incorporate powder of superconductive compound metal oxide in resin (plastic) materials and accomplished in this invention.

SUMMARY OF THE INVENTION

This invention provides a superconductive resin material (composite) which comprises a resin matrix in which 70–90% by weight on the basis of the total composition of a superconductive compound metal oxide powder is homogeneously dispersed.

In the present invention, the term "rare earth metal" means Sc, Y, La, Ce, Pr, Nd, Pm, Sm, Eu, Gd, Tb, Dy, Ho, Er, Tm, Yb and Lu.

In the present invention, the term "alkaline earth metal" means Be, Mg, Ca, Sr and Ba.

In the composite of the present invention, the superconductive compound metal oxide powder is incorporated in an amount of 70–90% by weight on the basis of the total composition. Under 70%, the composite does not exhibit satisfactory superconductivity. Over 90%, the composite becomes brittle.

Almost all synthetic resins are usable as the matrix of the composite of the present invention. Preferred are thermoplastic resins such as acrylic resins, poly(vinyl chloride) resin, polyolefin resins (polyethylene, polypropylene, etc.), polystyrene, etc. Polyethylene and polypropylene are particularly preferred. These resins may be used singly or in combination. Of course, the resin may contain a plastisizer.

Incorporation of the superconductive compound metal oxide powder can be easily effected with two-roll roller apparatus, three-roll roller apparatus, kneader, extruder, and other known kneading apparatuses.

The composite of the present invention can also be prepared by mixing a superconductive compound metal oxide powder, a resin and a suitable solvent and removing the solvent after mixing. Such embodiment of the present invention will be suitable for obtaining a superconductive coating material. In the description of the present invention, the term "flexible" is used to encompass the concept of "bendable".

SPECIFIC DESCRIPTION OF THE INVENTION

The present invention will now be explained by way of working examples.

EXAMPLE 1

Respectively 22.6 g, 78.9 g and 47.7 g of copper oxide, yttrium oxide and barium carbonate were weighed and mixed and the mixture was fired in the atmosphere at 900° C. for 2 hours. The thus obtained powder had a particle size of about 1.5 μm. The powder was made into a compact, which exhibited superconductivity at 70K.

The powder was homogeneously mixed with a polyethylene (Shorex F171, supplied by Showa Denko K. K.) in a content ratio as indicated in Table 1 by means of a two-roll roller apparatus and heated and formed into a disk test piece 1 cm in diameter and 2 mm in thickness, which was tested for its Meissner effect. The results are shown in Table 1.

TABLE 1

| Oxide/Resin ratio | Room Temp. Resistance | Meissner Effect | Flexibility |
|---|---|---|---|
| 65/35 by wt. | $>10^{11}\Omega$ | Not observed | Exhibited |
| 75/25 by wt. | $\sim 10^{5}\Omega$ | Observed | Exhibited |
| 85/15 by wt. | $\sim 10^{5}\Omega$ | Observed | Exhibited |
| 95/5 by wt. | $\sim 10^{3}\Omega$ | Observed | Not exhibited |

EXAMPLE 2

The compound metal oxide powder prepared in Example 1 was mixed with an acrylic paint base ("2026GL Clear" supplied by Kansai Paint K.K.) in the amounts indicated in Table 2 by means of a disperser at 2000 rpm for 5 minutes. The obtained coating materials were applied to the surface of an acrylic resin sheet to a thickness of about 100 μm, and tested for Meissner effect. The results are also shown in Table 2.

TABLE 2

| Powder content | Room temp. resistance | Meissner effect | Flexibility |
|---|---|---|---|
| 60% by wt. | $>10^{11}\Omega$ | Not observed | Exhibited |
| 70% by wt. | $\sim 10^{5}\Omega$ | Observed | Exhibited |
| 90% by wt. | $\sim 10^{4}\Omega$ | Observed | Exhibited |
| 95% by wt. | Unable to be applied | | |

Although the invention has specifically been described with respect to only one superconductive compound metal oxide, generalization to the rare earth metals, the alkaline earth metals and the resins in general is justifiable. Because it is well known that all the rare earth metals and all the alkaline earth metals have very similar chemical properties as elements belonging to the same group in the periodical table and the relation between metal oxide and matrix resins are well recognized among those skilled in the art.

We claim:

1. In a composition, comprising a resin matrix and a compound metal oxide powder exhibiting the Meissner effect, the improvement being that said metal oxide powder is present in an amount of 70 to 90% by weight based on the total composition, wherein said compound metal oxide exhibiting the Meissner effect is a compound oxide of yttrium, barium and copper.

2. The composition of claim 1, wherein said resin is a thermoplastic resin.

3. The composition of claim 2, wherein said thermoplastic resin is selected from the group consisting of acrylic resins, poly(vinyl chloride), polyolefin resins, and polystyrene.

4. The composition of claim 3, wherein said resin is selected from the group consisting of polyethylene and polypropylene.

5. The composition of claim 1, further comprising a plasticizer.

* * * * *